United States Patent
Kim et al.

(10) Patent No.: US 6,452,441 B1
(45) Date of Patent: Sep. 17, 2002

(54) LOW THRESHOLD VOLTAGE DEVICE WITH CHARGE PUMP FOR REDUCING STANDBY CURRENT IN AN INTEGRATED CIRCUIT HAVING REDUCED SUPPLY VOLTAGE

(75) Inventors: Yong Kim; Lee Edward Cleveland, both of Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/411,169

(22) Filed: Oct. 1, 1999

(51) Int. Cl.[7] ............................................. H01L 25/00
(52) U.S. Cl. ...................... 327/544; 327/566; 365/227
(58) Field of Search .................. 327/538, 543, 327/544, 390, 108, 589, 564, 566; 365/227

(56) References Cited

U.S. PATENT DOCUMENTS

| | | | | |
|---|---|---|---|---|
| 5,404,053 A | * | 4/1995 | Poma et al. ................. | 327/108 |
| 5,426,334 A | * | 6/1995 | Skovmand ................... | 327/536 |
| 5,592,117 A | * | 1/1997 | Nadd .......................... | 327/374 |
| 5,672,992 A | * | 9/1997 | Nadd .......................... | 327/537 |
| 5,703,769 A | * | 12/1997 | Murray ........................ | 323/908 |
| 5,939,908 A | * | 8/1999 | Moore et al. ................ | 327/108 |
| 6,275,395 B1 | * | 8/2001 | Inn et al. ...................... | 363/60 |

* cited by examiner

Primary Examiner—Timothy P. Callahan
Assistant Examiner—Terry L. Englund

(57) ABSTRACT

An integrated circuit (100) has an input (110) for receiving an externally applied power supply voltage. Internal to the integrated circuit, a pass transistor (104) conveys the supply voltage to an internal supply node (120) which supplies the operating circuitry (102) of the integrated circuit. The pass transistor has a relatively low threshold voltage for operation at reduced supply voltage, such as 1.0 volt. The pass transistor is controlled by an enable signal received at an input (112) and by a charge pump (106). In a standby mode, the charge pump raises the voltage on the gate of the pass transistor to fully turn off the pass transistor and minimize standby current.

20 Claims, 2 Drawing Sheets

LOW THRESHOLD VOLTAGE DEVICE WITH CHARGE PUMP FOR REDUCING STANDBY CURRENT IN AN INTEGRATED CIRCUIT HAVING REDUCED SUPPLY VOLTAGE

BACKGROUND OF THE INVENTION

The present invention relates generally to integrated circuit design. More particularly, the present invention relates to circuit design techniques to ensure high-speed, low-power operation at reduced supply voltages in semiconductor memory devices.

In the design of integrated circuits, there is a trend to power the integrated circuits using decreasing supply voltage levels. Previous circuit families operated at 5 volts and 3.3 volts. Current families operate at 1.8 volts and future families will operate at 1.0 volts nominal supply voltage. Under worst case conditions, the supply voltage may be as low as 0.9 volts. These lower supply voltages create design and operation problems.

One problem is encountered when adapting conventional complementary metal-oxide-semiconductor (CMOS) circuits for low voltage operation. Conventional n-channel and p-channel transistors have threshold voltages (also called turn-on voltages) too large for satisfactory operation in low voltage applications. For example, a conventional p-channel transistor has a threshold voltage of approximately –1.2 V and a conventional n-channel transistor has a threshold voltage of approximately 1.1 V. In a 1.0 volt supply device, these conventional transistors will never be turned fully on to sink or source current to a load.

One solution is lowering the threshold voltage of the transistors. With the magnitude of the p-channel and n-channel threshold voltages set at, for example, 0.5 volts, the transistors can turn on fully even at worst case supply voltages. This is important to device performance, since the drain current $I_{DS}$ is proportional to the square of the difference between the drain to source voltage $V_{DS}$ and the threshold voltage Vt. However, transistors with low threshold voltages tend to have higher subthreshold current leakage. In a large integrated circuit with thousands or millions of transistors, the total standby current would be too large for practical applications. The large standby current would increase overall power consumption for the device to unacceptable levels.

Accordingly there is a need for an improved method and apparatus for reducing standby current in an integrated circuit, particularly an integrated circuit employing reduced-threshold voltage transistors in a low supply voltage application.

BRIEF SUMMARY OF THE INVENTION

By way of introduction only, an integrated circuit in accordance with the present invention disconnects supply power to the integrated circuit in standby mode to reduce or eliminate standby current. A large transistor is used to supply power to the entire chip. Only the source of the transistor is coupled to the power supply node. A transistor having a relatively low threshold voltage, such as 0.5 volts, is used as the pass transistor. During standby, the gate of this transistor is pumped to a voltage above the supply voltage using a charge pump in order to turn off the transistor fully. The charge pump is driven by a clock circuit which is designed so that there is minimal crowbar current. As a result, the only standby current is in the charge pump and the clock circuit, and both are designed to be minimal. As a result, low threshold voltage devices can be used in a low power supply environment without concern for excessive standby leakage current.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
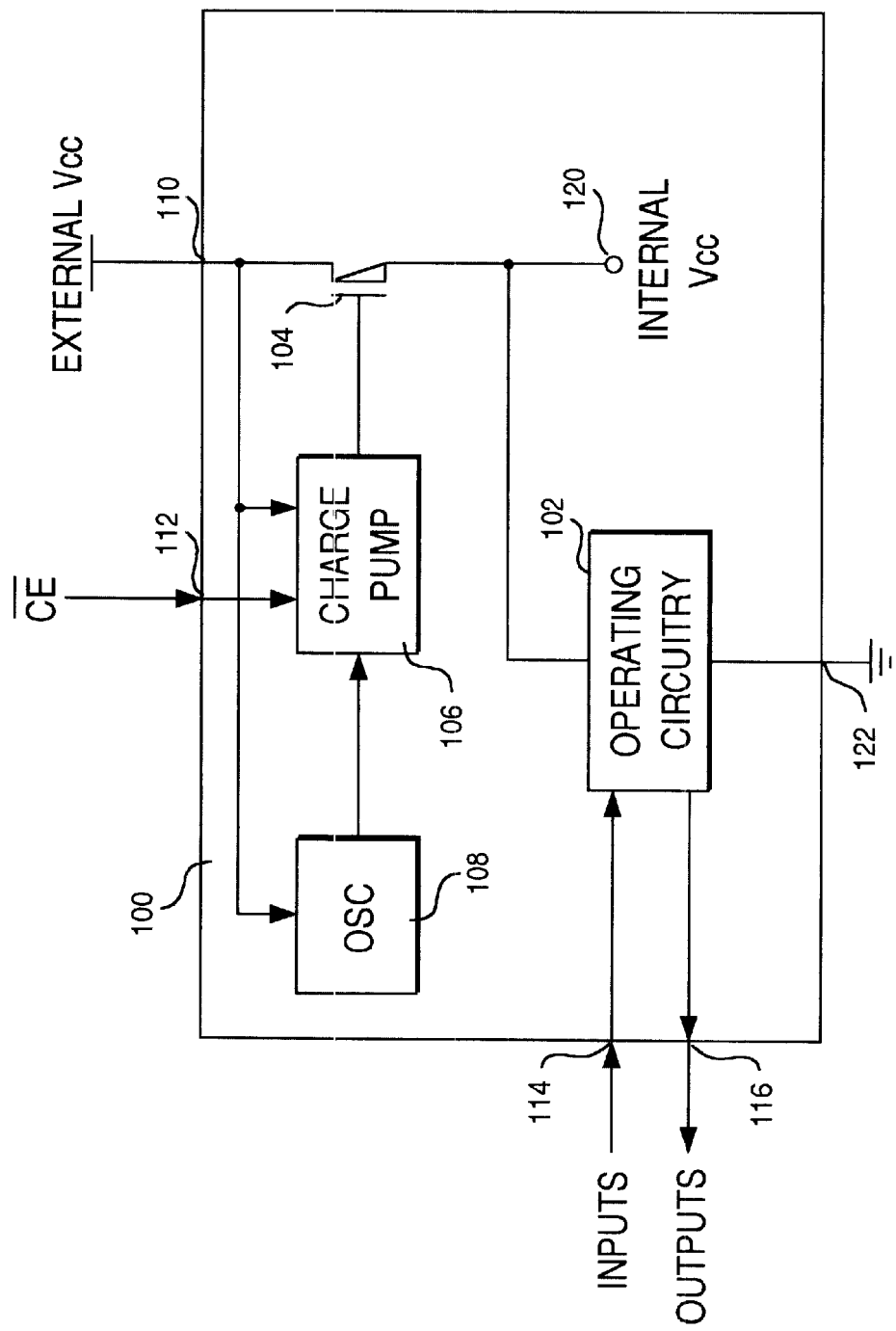
FIG. 1 is a block diagram of an integrated circuit.

Referring now to the drawing, FIG. 1 shows a block diagram of an integrated circuit 100. The integrated circuit 100 may be any integrated circuit manufactured in any suitable technology. In the illustrated embodiment, the integrated circuit 100 is a flash memory chip fabricated using a complementary metal oxide semiconductor (CMOS) manufacturing process adapted to low voltage operation. By low voltage it is meant that the integrated circuit 100 is designed to operate at a very low supply voltage, the supply voltage being defined as the potential difference between a supply voltage level and ground. In the exemplary embodiment, the supply voltage labelled VCC is nominally 1.0 V±0.1 V.

The integrated circuit 100 includes operating circuitry 102, a pass transistor 104, a charge pump 106, and an oscillator 108. Further, the integrated circuit 100 includes an input 110 configured to receive an external supply voltage, a control input 112 and operational inputs 114 and outputs 116. The operating circuitry 102 performs the operational functions of the integrated circuit 100. For example, in the illustrated embodiment of a memory chip, the operating circuitry 102 includes such structure as a core cell array for storing data, an x-decoder and a y-decoder for uniquely selecting data storage locations in the core cell array, programming circuitry for storing data in the core cell array, and other operational circuitry. Address data are received at the inputs 114 and data is provided at outputs 116. In other embodiments, the operating circuitry 102 will include other circuitry required to perform the necessary function of the integrated circuit 100.

The pass transistor 104 selectively couples the input 110 to an internal supply node 120. The input 110 is configured to receive an external supply voltage, labeled external VCC in FIG. 1. The external supply voltage is typically the most positive voltage available and is used for powering the integrated circuit 100 and other components in a system including the integrated circuit 100. The external VCC supply voltage has a nominal value such as 1.0 volts but may vary from this nominal value, for example plus or minus 0.1 volts. The external supply voltage is applied to the input 110 which may be, for example, a bonding pad of the integrated circuit 100 or a pin or other electrical contact of the package containing the integrated circuit 100. The internal supply node 120 is the node which conveys operating power to the operating circuitry 102 of the integrated circuit 100. Thus, aside from the pass transistor 104, the charge pump 106 and the oscillator circuit 108, all circuitry on the integrated circuit 100 receives operating power on the internal supply node 120. The integrated circuit 100 further includes a ground node 122 which supplies a ground potential to the integrated circuit 100.

The pass transistor 104 thus supplies operating power to the entire integrated circuit 100, excluding the charge pump 106 and the oscillator 108. The pass transistor 104 is fabricated to have a relatively low threshold voltage. This is indicated by the diagonal line through the symbol for the pass transistor 104. The pass transistor 104 is a p-channel transistor fabricated to have a nominal threshold voltage of approximately −0.5 volts. This design parameter may be achieved by any suitable technique, such as by omitting the channel implant during fabrication of the transistor 104, or by reducing the thickness of the gate oxide of the transistor 104. The threshold voltage for the pass transistor 104 differs from threshold voltages for other transistors used, for example, in the operating circuitry 102 of the integrated circuit 100. For conventional logic functions and for memory cell devices, transistors will typically have a threshold voltage of approximately −1.2 volts. The low threshold voltage of the pass transistor 104 is particularly well suited to applications involving low supply voltage, such as supply voltage of 1.0 volts. The pass transistor 104 has a source coupled to the input 110, a drain coupled to the internal supply node 120 and a gate coupled to the charge pump 106.

The charge pump 106 is coupled to the pass transistor 104 for providing a bias voltage to the pass transistor 104. The charge pump 106 receives as an input an enable signal provided to the input 112 of the integrated circuit 100. In the illustrated embodiment, the chip enable 112 input of the integrated circuit 100 serves as the activating input for the charge pump, but other inputs or combinations of inputs to the integrated circuit 100 could be used as well. In response to the enable signal at the chip enable input 112, the pass transistor 104 selectively decouples the input 110 from the internal supply node 120, in response to the actuation by the charge pump 106. The charge pump charges and discharges a charge storage node to control the voltage on the gate of the pass transistor 104.

The oscillator 108 is coupled to the charge pump 106 and provides clocking signals to the charge pump 106. The oscillator 108 may be any suitable oscillating circuit but preferably is designed to minimize crowbar current which occurs when CMOS devices switch. The charge pump 106 and the oscillator 108 will be described in further detail in conjunction with FIG. 2.

Figure 2:
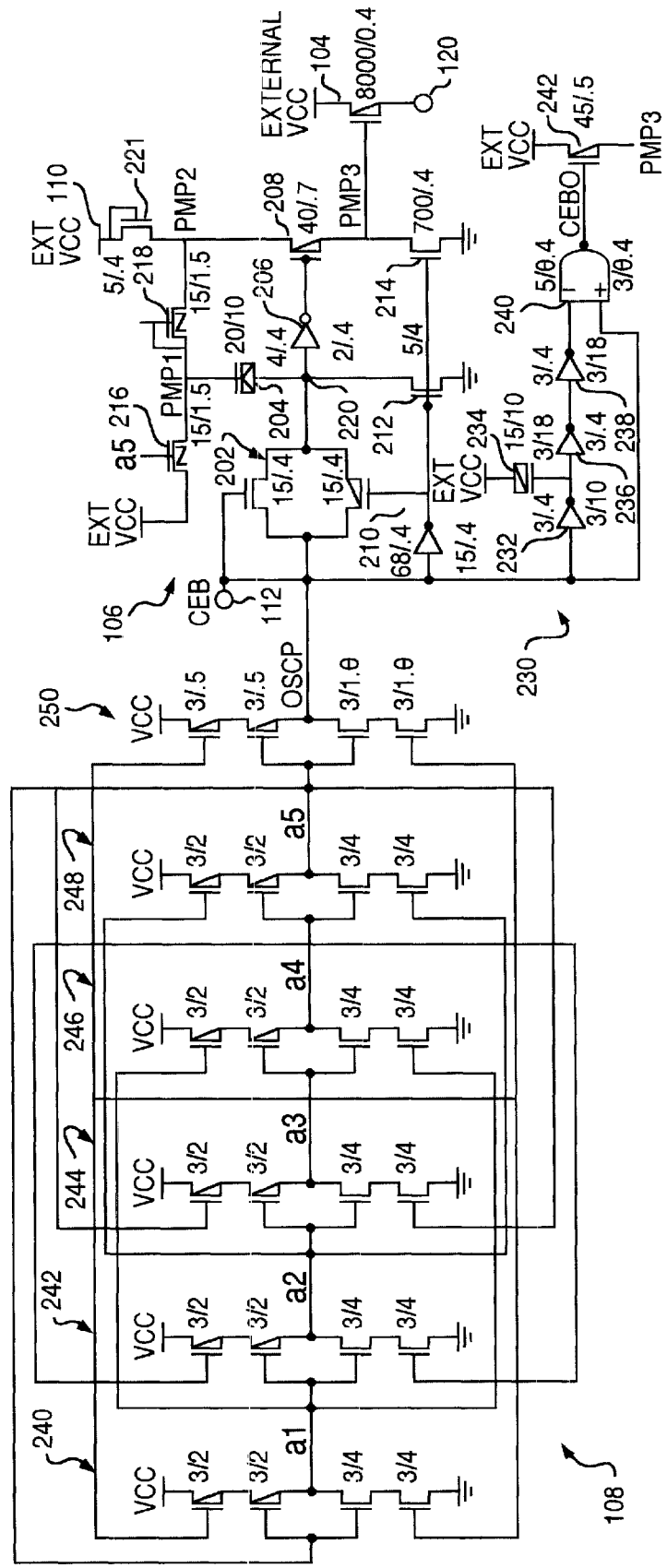
FIG. 2 is a schematic diagram of a portion of the integrated circuit of FIG. 1.

FIG. 2 is a schematic diagram of a portion of the integrated circuit 100. In FIG. 2, relative transistor sizes are illustrated in units of micrometers. The sizes have been found to be suitable for devices manufactured according to one particular processing technology. Other device sizes and circuit configurations may be substituted to perform similar functions.

In FIG. 2, the pass transistor 104 is shown with a source coupled to external VCC and a drain coupled to the internal supply node 120. The gate of the pass transistor 104 is coupled to a node labeled pmp3, which is driven by the charge pump 106.

The charge pump 106 includes a transmission gate 202, a capacitor 204, an inverter 206 and a low-threshold p-channel transistor 208. The charge pump 106 further includes an inverter 210, a transistor 212 and a transistor 214. The charge pump 106 still further includes a pass transistor 216 and a diode-connected transistor 218, as well as a diode-connected transistor 221. The transmission gate 202 receives an oscillating signal on a node labeled OSCP in FIG. 2. The transmission gate 202 is actuated by a control signal received at the input 112, labeled CEB and corresponding to the chip enable input of the integrated circuit 100. This signal is applied directly to the gate of a n-channel transistor and inverted by the inverter 210 for application to a gate of a p-channel transistor of the transmission gate 202. The transmission gate 202 operates conventionally as a switch which selectively couples the oscillating signal from the oscillator 108 to a charge storage node 220 of the capacitor 204. The capacitor 204 may be any suitably formed capacitor or other device which stores charge. The capacitor 204 thus forms a charge storage means which is coupled to the pass transistor 104, and the charge pump 106 forms a means for charging and discharging the storage means in response to a control signal, the chip enable signal at the input 112.

Charge is stored across the capacitor 204 between node 220 and the node labeled pmp1. The transistor 216 and transistor 218 are preferably both zero threshold transistors, manufactured to have threshold voltages substantially equal to zero volts. That is, when the gate to source voltage of transistor 216, 218 is at the threshold voltage of zero volts, these transistors are turned on and conducting. The gate to source voltage must be made negative in order to turn off these transistors. Use of zero threshold transistors for transistor 216 and transistor 218 minimizes threshold voltage drop through the charge pump 106. Thus, the node labeled pmp2 is a threshold voltage below the node labeled pmp1, where the threshold voltage is substantially equal to zero volts. Transistor 221 is configured as a diode and coupled between node pmp2 and external VCC to isolate the charge storage node from the supply node.

The gate of the transistor 216 is controlled by the voltage at a node labeled A5. This node is within the oscillator 108 and is out of phase with the oscillating signal on the node OSCP. The drain of the transistor 216 is coupled to external VCC, the external supply voltage. By controlling the gate of the transistor 216 with the voltage on node A5, charge is prevented from escaping through the transistor 216 to external VCC when the charge pump 106 is in operation.

When charge is stored on the capacitor 204, the inverter 206 produces a low signal at the gate of the transistor 208 so that transistor 208 is turned on, coupling node pmp3 and node pmp2. Preferably, with the charge pump 106 active, the voltage on node pmp3 is charged to a voltage approximately 300 mV above external VCC. Under this condition, the gate-to-source voltage of transistor 104 will be approximate +300 mV, much less than the −0.5 V threshold voltage required to turn on this transistor. The pass transistor 104 will be fully turned off, isolating the internal supply node from the external VCC supply node. By raising the voltage at the gate of the pass transistor 104 above VCC using the charge pump 106, the leaky, low threshold voltage pass transistor 104 can be fully turned off, minimizing leakage current in this transistor.

This turn-off of the pass transistor 104 corresponds to placing the integrated circuit 100 in a standby mode, since with the pass transistor 104 turned off, no supply voltage is provided to the operating circuitry 102 of the integrated circuit. All the voltage nodes of the operating circuitry 102 are left to float. The nodes must subsequently be charged or discharged to appropriate voltages when exiting the standby mode for active mode, when the pass transistor 104 is turned on to provide operating power to the operating circuitry 102.

When the enable signal is applied, the voltage at the input 112 moves from a logic high to a logic low level. With signal CEB at a low level, the transmission gate 202 is turned off and the charge pump 106 is isolated from the oscillator circuit 108. The inverter 210 inverts the signal CEB and provides a high voltage level to the gates of transistor 212 and transistor 214, turning on these transistors. Transistor 212 discharges the capacitor 204. Transistor 214 discharges the node pmp3 and pulses the gate of the pass transistor 104 to ground. With node pmp3 grounded, pass transistor 104 is fully turned on, its gate to source voltage equal to the potential difference between external VCC and ground potential, minus the drain of source voltage of transistor 214. Since pass transistor 104 is a low threshold voltage device, with a threshold voltage of substantially −0.5 volts, the gate to source voltage for this transistor exceeds the threshold voltage and transistor 104 turns on hard. Preferably, the pass transistor 104 is sized to ensure 20 mA sourcing capability with 100 mV drop across the source and drain.

The charge pump 106 further includes a reset circuit 230. The reset circuit 230 includes an inverter 232, a capacitor 234, an inverter 236, an inverter 238, a NAND gate 240 and a low threshold p-channel transistor 242. The capacitor 234 operates to slow the switching of the signals in the leg including the inverters so that when the CEB signal transitions from a low value to a high value, a short pulse is produced at the gate of the p-channel transistor 242. The drain of the transistor 242 is coupled to node pmp3 and the source of this transistor is coupled to external VCC. The pulse at the output of the NAND gate 240 briefly turns on the transistor 242, coupling node pmp3 to external VCC. This operates to quickly reset the gate of the pass transistor 104 to VCC, substantially turning off the pass transistor 104. With node pmp3 at VCC, the gate to source voltage of the pass transistor 104 is equal to zero volts and the pass transistor 104 is substantially off. However, because the pass transistor 104 is a low threshold transistor, it does have non-negligible subthreshold leakage current. After resetting node pmp3 to VCC immediately upon the transition of signal CEB from low to high, the high value on signal CEB turns on the transmission gate 202 so that the oscillating signal OSCP is applied to the charge pump 106 and the node pmp3 begins to charge to a voltage greater than VCC to fully turn off the pass transistor 104.

The oscillating circuit 108 in the illustrated embodiment of FIG. 2 is configured as a look-ahead type of oscillator having five stages (e.g., 240–248) and one output stage (e.g., 250). Each stage includes two n-channel transistors and two p-channel transistors. The gates of the transistor pairs are interconnected between stages to ensure that no complete electrical path between VCC and ground is ever formed. This minimizes the crowbar current which flows when some CMOS gates switch, when both a p-channel transistor tied to VCC and a n-channel transistor tied to ground are turned on and conducting at the same time.

Crowbar current can flow even for very short periods as one transistor turns on and the complementary transistor turns off. By minimizing the crowbar current, the standby current for the integrated circuit 100 including the oscillator 108 is minimized. This is especially important because, as configured in FIG. 2, the oscillator 108 remains running even when the integrated circuit 100 is placed in standby mode. Preferably, the charge pump 106 is also designed to minimize operating currents such as crowbar current when not in operation. Crowbar current is a particular source of standby current. By minimizing the crowbar current in the charge pump 106 and the oscillator 108, the overall standby current for the integrated circuit is minimized. In one implementation, the crowbar current for the oscillator 108 and the charge pump 110 combined is less than 10 μA.

Preferably, the output frequency for the signal OSCP from oscillator 108 is in a range 2.5 to 5 megahertz. This ensures rapid charging of the charge pump 106 when the integrated circuit 100 enters the standby mode without generating unnecessarily high standby current due to capacitive charging and discharging.

From the foregoing, it can be seen that the present invention provides an improved method and apparatus for reducing standby current in an integrated circuit. It has particular application to an integrated circuit employing reduced-threshold voltage transistors in a low supply voltage application. A large, low threshold p-channel transistor is used to supply VCC to the entire integrated circuit. During standby mode, the gate of this p-channel transistor is pumped to a voltage above VCC using a simple, single stage charge pump. Raising the gate voltage fully turns off the p-channel transistor, minimizing standby current. Zero threshold transistors are used in diode configuration to minimize threshold voltage drop throughout the pump. A p-channel transistor at the output stage of the charge pump prevents loss of charge from the storage node to VCC. When entering the active mode from standby, the gate of the p-channel pass transistor is quickly grounded to turn on the transistor and rapidly provide operating power to the operating circuitry of the integrated circuit. The oscillator for the charge pump runs continuously regardless of the enable state of the integrated circuit 100. The oscillator employs a design in which there is no crowbar current, only capacitive charging and discharging, to minimize power dissipation.

While a particular embodiment of the present invention has been shown and described, modifications may be made. For example, other types of charge pump circuits may be substituted and other types of oscillators may be used for the embodiments illustrated in the drawing. It is therefore intended in the appended claims to cover all such changes and modifications which fall within the true spirit and scope of the invention.

What is claimed is:

1. An integrated circuit comprising:
   an input configured to receive an external supply voltage;
   a pass transistor which selectively couples the input to an internal supply node, the pass transistor having a reduced threshold voltage not greater than 1.0 V;
   operating circuitry coupled to the internal supply node;
   an enable signal input configured to receive an external enable signal that is utilized to trigger a reduction of standby current in the integrated circuit; and
   a charge pump coupled to the pass transistor for providing a bias voltage to the pass transistor, the charge pump coupled to the enable signal input to receive the external enable signal,
   in response to the charge pump receiving the external enable signal, the charge pump is configured to fully turn off the pass transistor which isolates the internal supply node from the external supply voltage and reduces standby current of the integrated circuit.

2. The integrated circuit of claim 1 wherein the pass transistor has a drain coupled to the input, a source coupled to the internal supply node, and a gate coupled to the charge pump.

3. The integrated circuit of claim 2 wherein the pass transistor turns fully on to couple the input to the internal supply node in response to the bias voltage.

4. The integrated circuit of claim 3 wherein the pass transistor has a nominal threshold voltage of substantially 0.5 volt and the external supply voltage is nominally 1.0 volt.

5. The integrated circuit of claim 1 wherein the operating circuitry comprises memory.

6. The integrated circuit of claim 1 further comprising an oscillator coupled to the charge pump.

7. The integrated circuit of claim 6 wherein the charge pump is configured to selectively remove the bias voltage from the pass transistor in response to receiving the external enable signal.

8. The integrated circuit of claim 1 wherein the operating circuitry comprises flash memory.

9. The integrated circuit of claim 6 wherein the oscillator comprises a look-ahead oscillator having a plurality of stages.

10. The integrated circuit of claim 9 wherein oscillator crowbar current is minimized.

11. The integrated circuit of claim 10 wherein charge pump crowbar current is minimized.

12. A method for reducing standby current in an integrated circuit, the method comprising:
  (a) a pass transistor receiving an external reference voltage at an input of the integrated circuit;
  (b) a charge pump receiving an external enable signal at an enable input of the integrated circuit, the external enable signal is utilized to trigger the reduction of standby current in the integrated circuit;
  (c) in an active mode, providing the external reference voltage through the pass transistor to an internal supply node for powering operating circuitry of the integrated circuit, the pass transistor having a reduced threshold voltage not greater than 1.0 V;
  (d) in a standby mode, removing the external reference voltage from the internal supply node; and
  (e) in the standby mode, the charge pump varying a bias voltage of the pass transistor to fully turn off the pass transistor which isolates the internal supply node from the external reference voltage and reduces the standby current of the integrated circuit.

13. The method of claim 12 wherein said (c) comprises:
turning on the pass transistor to supply operating current substantially at the external reference voltage to the operating circuitry.

14. The method of claim 13 wherein said (e) comprises:
pumping charge to a capacitive node coupled with a gate of the pass transistor to fully turn off the pass transistor.

15. The method of claim 14 further comprising:
  (f) switching the gate of the pass transistor to a turn-on voltage when entering the active mode.

16. The method of claim 15 wherein said (f) comprises:
turning on a transistor to discharge the capacitive node.

17. An integrated circuit comprising:
  an input means for receiving an external supply voltage for powering operating circuitry of the integrated circuit;
  an input enable means for receiving an external enable signal that is utilized to trigger a reduction of standby current of the integrated circuit;
  a pass transistor coupled between the input means and an internal supply node, the pass transistor having a reduced threshold voltage not greater than 1.0 V; and
  switch means coupled to the input means and the input enable means,
  in response to the switch means receiving the external enable signal, the switch means selectively turns off the pass transistor to decouple the external supply voltage from the internal supply node thereby reducing standby current of the operating circuitry of the integrated circuit.

18. The integrated circuit of claim 17 wherein the switch means comprises:
  charge storage means coupled to the pass transistor; and
  means for charging and discharging the charge storage means in response to the external enable signal.

19. The integrated circuit of claim 17 wherein the operating circuitry comprises memory.

20. The integrated circuit of claim 18 wherein the charge storage means stores charge to reduce gate to source voltage of the pass transistor in a standby mode to fully turn off the pass transistor.

* * * * *